United States Patent [19]

Goto

[11] Patent Number: 5,182,480
[45] Date of Patent: Jan. 26, 1993

[54] PULSE DELAY CIRCUIT HAVING TWO COMPARATORS

[75] Inventor: Kuniaki Goto, Yokosuka, Japan

[73] Assignee: Kabushiki Kaisha Toshiba, Kawasaki, Japan

[21] Appl. No.: 584,979

[22] Filed: Sep. 19, 1990

[30] Foreign Application Priority Data

Sep. 21, 1989 [JP] Japan .................. 1-243312

[51] Int. Cl.$^5$ ............................................. H03K 5/159
[52] U.S. Cl. ................................... 307/608; 307/601; 307/358; 328/55
[58] Field of Search ............... 307/267, 265, 359, 358, 307/601, 608, 603, 605; 328/55, 58

[56] References Cited

U.S. PATENT DOCUMENTS

| | | | |
|---|---|---|---|
| 3,979,683 | 9/1976 | Ikeda ........................................ | 328/55 |
| 4,322,642 | 3/1982 | Sugasawa ................................ | 307/358 |
| 4,339,727 | 7/1982 | Kage et al. ............................... | 307/359 |
| 4,469,082 | 9/1984 | Nishitoba et al. ....................... | 307/265 |
| 4,975,657 | 12/1990 | Eastmond .............................. | 307/358 |

OTHER PUBLICATIONS

Patent Abstracts of Japan, vol. 6, No. 259, dated Dec. 17, 1982.
Patent Abstracts of Japan, vol. 11, No. 363, dated Nov. 26, 1987.

*Primary Examiner*—William L. Sikes
*Assistant Examiner*—Toan Tran
*Attorney, Agent, or Firm*—Finnegan, Henderson, Farabow, Garrett and Dunner

[57] ABSTRACT

A pulse signal delay circuit comprises an input node for receiving a first pulse signal, an output node for outputting a second pulse signal, a delay circuit for delaying the first pulse signal to provide a delayed signal, a first comparator for comparing the first pulse signal with the second pulse signal to output a first comparison result, and a second comparator for comparing the first comparison result with the delayed signal to output a second comparison result.

12 Claims, 3 Drawing Sheets

PULSE DELAY CIRCUIT HAVING TWO COMPARATORS

BACKGROUND OF THE INVENTION

1. Field of the Invention

This invention relates to a pulse generation circuit used in an electronic circuit of a communication device such as a television receiver.

2. Description of the Related Art

FIG. 3 is a block diagram showing a pulse delay circuit. In operation, a pulse P1 input to an input terminal IN is supplied to a time constant circuit formed of a resistor $R_1$ and a capacitor $C_1$, via a buffer amplifier, so that a wave P2 which is delayed by time $t_1$ with respect to the pulse P1 can be derived from a point a. The wave P2 is input to the next stage comparator (COMP) 23, sliced at a voltage level $V_{th}$, and output as an output wave P3 from an output terminal OUT.

The waveforms P1-P3 thus obtained are shown in FIG. 4.

In the above described case, in order to generate the pulse P3 which is delayed by the time $t_1$ with respect to the pulse P1, it is only necessary to determine the delay time $t_1$ by the resistor $R_1$ and the capacitor $C_1$. However, in order to determine the pulse width of the pulse P3, it has been necessary to change the reference voltage $V_{th}$ to adjust the slice level of the wave P2 at the point a. The adjustment of the reference voltage $V_{th}$ must be effected each time the pulse delay time $t_1$ is changed, thus causing a troublesome problem.

SUMMARY OF THE INVENTION

An object of this invention is to provide a pulse circuit capable of automatically adjusting the pulse widths of input and output signals to have a fixed relation therebetween.

A pulse signal delay circuit of the invention comprises an input node for receiving a first pulse signal; an output node for outputting a second pulse signal; a delay circuit for delaying the first pulse signal from the first output node to provide a delayed signal; a first comparator for comparing the first pulse signal from the input node with the second pulse signal from the output node to output a first comparison result; and a second comparator for comparing the first comparison result from the first comparator with the delayed signal from the delay circuit to output a second comparison result.

With the above construction, a voltage (or current) which is proportional to the pulse width of the input pulse signal is compared with a voltage (or current) which is proportional to the pulse width of the output signal output from the circuit by means of the first comparator so as to generate a difference therebetween. When a voltage (or current) corresponding to the generated difference and a pulse delayed by the delay circuit are input to the second comparator, the pulse width of a pulse signal which has been delayed by the delay circuit is set to be equal to the pulse width of the input pulse signal and then the pulse is derived from the output terminal OUT. As a result, the pulse widths of the input and output pulse signals are automatically set equal to each other irrespective of the delay time set. Therefore, it becomes unnecessary to set the circuit parameters again.

Further, it is also possible to set the ratio of the input pulse width to the output pulse width to a constant value, for example, 1:2 or 1:10, by changing and adjusting the circuit parameters.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Figure 2:
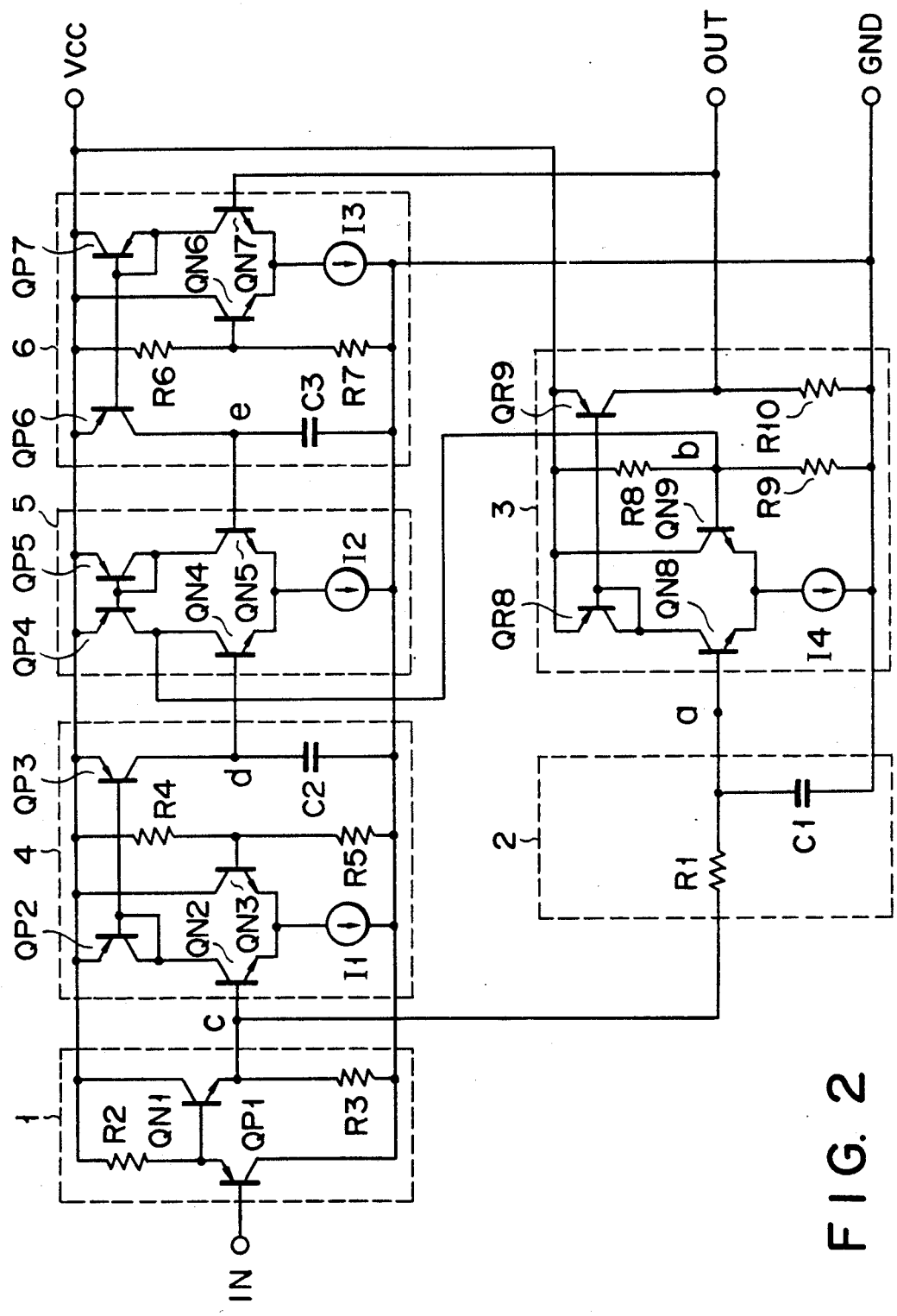
FIG. 2 is a circuit diagram of a pulse circuit showing an embodiment of this invention.
Figure 3:
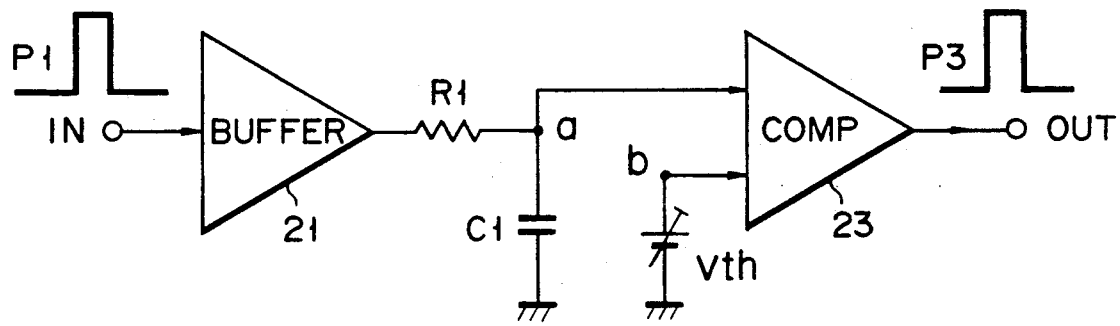
FIG. 3 is a circuit diagram showing a pulse circuit to which this invention is not applied.
Figure 4:
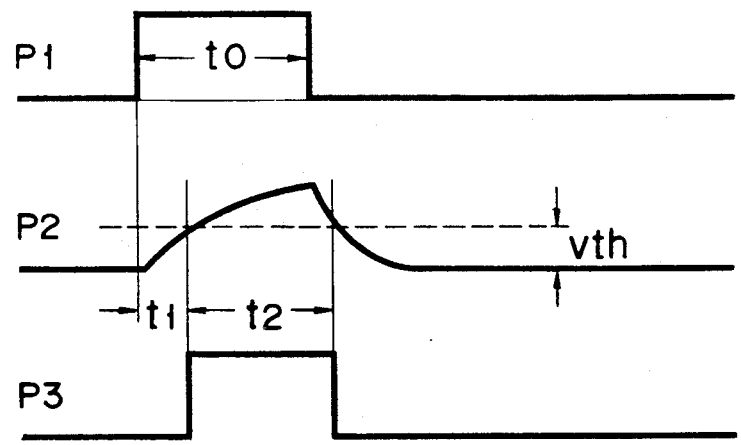
FIG. 4 is a timing chart for illustrating the operation of a pulse delay circuit of this invention.

FIG. 2 is a circuit diagram showing one embodiment of this invention.

Figure 1:
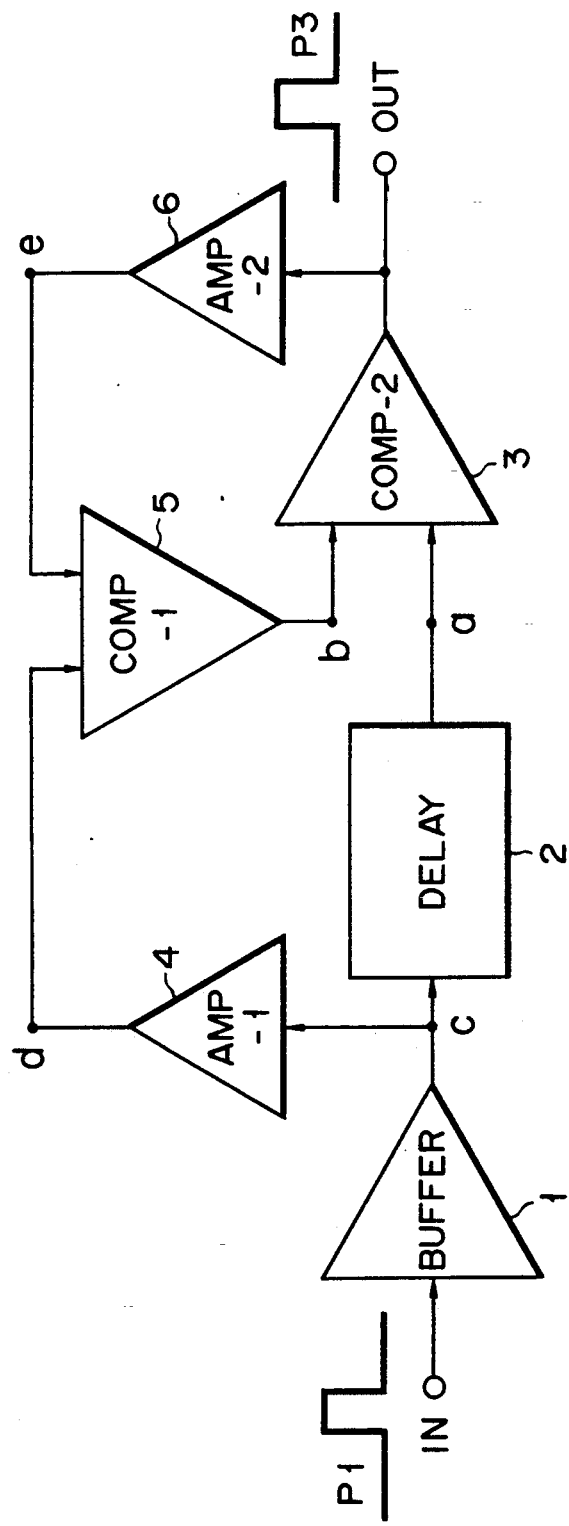
FIG. 1 is a block diagram of a pulse circuit showing an embodiment of this invention.

The construction shown in FIG. 2 is the same as that shown in the block diagram shown in FIG. 1.

In FIG. 2, 1 denotes an example of a buffer amplifier. The buffer amplifier is constituted by a first transistor QP1 which is of PNP type, an NPN transistor QNI, and resistors R2 and R3 and is used to effect the impedance conversion with respect to an input pulse signal.

2 denotes an example of a delay circuit which is constituted by a resistor $R_1$ and a capacitor $C_1$ and functions to determine the delay time based on the time constant of the resistor and capacitor.

Further, 3 denotes an example of a second comparator constituted by NPN transistors QN8 and QN9, PNP transistors QP8 and QP9, resistors R8, R9 and R10, and a fourth current source $I_4$. A difference current generated in the first comparator 5 is input to b and a wave of a delayed pulse signal is input to "a". The delayed pulse signal is sliced by a voltage at b. As a result, the pulse widths of the input pulse signal and output pulse signal are set equal to each other and the pulse signal is output from the output terminal OUT.

4 denotes an example of a first amplifier. This circuit is constituted by NPN transistors QN2 and QN3, PNP transistors QP2 and QP3, a first current source $I_1$, resistors R4 and R5, and a capacitor $C_2$. In this circuit, a current which is proportional to the pulse width of an input pulse signal is charged by means of QP3 into C2 (thus the amplifier acts as an integrator) and is output as a voltage from "d".

Further, 5 denotes an example of the first comparator. The circuit is constituted by NPN transistors QN4 and QN5, PNP transistors QP4 and QP5, and a second current source $I_2$. The first comparator 5 compares voltages output from the first and second amplifiers with each other and converts a voltage difference into a current which is output as voltage from the point "b". The first comparator compares the pulse width of an input pulse signal and the pulse width of an output pulse signal with each other and generates a difference represented in terms of voltage.

6 denotes an example of the second amplifier. The circuit is constituted by PNP transistors QP6 and QP7, NPN transistors QN6 and QN7, resistors R6 and R7, a capacitor C3, and a third current source I3. The second amplifier causes a current which is proportional to the pulse width of an output pulse to be charged into the capacitor C3 via the PNP transistor QP6 (thus the amplifier acts as an integrator) and output as a voltage from "e".

This invention is not limited to the above embodiment and various modifications can be made.

For example, the pulse widths of input and output pulse signals set in the circuit of this invention can be selectively set to be equal to each other or set in the ratio of an integral number if necessary.

A concrete method of changing the relation between the input and output may be realized by changing the amplification factors of the comparators COMP-1 and -2, the gains of the AMP-1 and -2 or the like.

More specifically, in the case of the COMP-1, the ratio of the areas of the transistors QN4,, QN5, QP4 and QP5 in the block 5 is changed. That is, the amplification factor of the comparator COMP-1 can be changed by changing the ratio of the area of the transistors QN4 and QP4 to the area of the transistors QN5 and QP5 which is set to 1:x (at this time, the ratio of the area of the transistor QN4 to that of the transistor QP4 and the ratio of the area of the transistor QN5 to that of the transistor QP5 are kept unchanged). As a result, the slice level is changed and the pulse width of P3 can be changed. Further, in the case of the comparator COPM-2, the resistances of R8 and R9 in the block 5 in the embodiment of FIG. 2 are set to proper values without changing the ratio thereof.

In the case of the gain of the AMP-1, the ratio of the areas of the transistors QP2 and QP3 in the block 4 is changed, and in the case of the gain of the AMP-2, the ratio of the areas of the transistors QP6 and QP7 in the block 4 is changed.

In the conventional pulse delay circuit, the pulse width of the delayed pulse signal is set each time delay time is selectively set, but the proportional relation between the pulse widths of the input and output pulse signals can be automatically obtained with respect to a selectively set delay time or a given input signal if the circuit parameters are initially set by using the circuit construction of this invention. In this way, the operation of adjusting the pulse width of a pulse signal or an external device for effecting the operation can be alleviated or omitted.

Additional advantages and modifications will readily occur to those skilled in the art. Therefore, the invention in its broader aspects is not limited to the specific details, and representative devices, shown and described. Accordingly, various modifications may be made without departing from the spirit or scope of the general inventive concept as defined by the appended claims and their equivalents.

What is claimed is:

1. A circuit for receiving and generating pulses, the circuit comprising:
   receiving means for receiving a first signal having a first signal pulse;
   first generating means, responsive to the first signal pulse, for generating a second signal to indicate a width of the first signal pulse;
   second generating means, having an input for receiving a third signal having a third signal pulse, for generating a fourth signal to indicate a width of the third signal pulse;
   delaying means for delaying the first signal to generate a fifth signal;
   comparing means for comparing the second signal to the fourth signal to generate a sixth signal; and
   third generating means, responsive to the fifth and sixth signals, for generating the third signal having the third signal pulse, the third signal pulse having a rising edge and a falling edge occurring in accordance with relative voltages of the fifth and sixth signals.

2. A circuit according to claim 1, wherein pulse widths of said first signal pulse and said third signal pulse are set to be substantially equal to each other.

3. A circuit according to claim 1, wherein a ratio of a pulse width of said first signal pulse to that of said third signal pulse is set to be substantially 1:2.

4. A circuit according to claim 1, wherein a ratio of a pulse width of said first signal pulse to that of said third signal pulse is set to an integral number.

5. A circuit according to claim 1, further comprising first amplifier means, connected to said receiving means, for amplifying said first signal to provide an amplified signal to said first generating means.

6. A circuit according to claim 5, further comprising second amplifier means, connected to said third generating means, for amplifying said third signal to provide another amplified signal to said second generating means.

7. A circuit according to claim 1, further comprising a buffer circuit, connected between said receiving means and said delaying means.

8. A circuit according to claim 1, wherein said delaying means includes a combination of a capacitor and a resistor.

9. A circuit according to claim 1, wherein the third generating means includes a second comparing means for comparing the fifth and sixth signals.

10. A circuit according to claim 1, further including a biasing means for biasing a node at a certain voltage, and wherein the third generating means includes
    second comparing means for comparing a voltage on a first input responsive to the fifth signal, with a voltage on a second input coupled to the node and responsive to the sixth signal.

11. A circuit for generating an output pulse in response to an input pulse, the circuit comprising:
    receiving means for receiving a first signal;
    delaying means for delaying the first signal to generate a second signal;
    first integrating means for integrating the first signal to generate a third signal;
    first comparing means having a first input, responsive to the third signal, and a second input, responsive to a fourth signal, for comparing the third signal and the fourth signal to generate a fifth signal;
    second comparing means for comparing the second signal and the fifth signal to generate a sixth signal; and
    second integrating means for integrating the sixth signal to generate the fourth signal.

12. The circuit of claim 11, further including:
    means for biasing a node at a voltage between a first reference voltage and a second reference voltage; and
    means four coupling the node to the second comparing means.

* * * * *